United States Patent
Suiter

(10) Patent No.: US 9,881,113 B2
(45) Date of Patent: Jan. 30, 2018

(54) LAYOUT SYNTHESIS OF A THREE-DIMENSIONAL MECHANICAL SYSTEM DESIGN

(71) Applicant: Mentor Graphics Corporation, Wilsonville, OR (US)

(72) Inventor: Gerald Suiter, Madison, AL (US)

(73) Assignee: Mentor Graphics Corporation, Wilsonville, OR (US)

(*) Notice: Subject to any disclaimer, the term of this patent is extended or adjusted under 35 U.S.C. 154(b) by 56 days.

(21) Appl. No.: 14/741,760

(22) Filed: Jun. 17, 2015

(65) Prior Publication Data

US 2016/0371402 A1  Dec. 22, 2016

(51) Int. Cl.
*G06F 17/50* (2006.01)

(52) U.S. Cl.
CPC .................................. *G06F 17/505* (2013.01)

(58) Field of Classification Search
CPC ..................................................... G06F 17/5068
USPC ........................................................ 716/104
See application file for complete search history.

(56) References Cited

U.S. PATENT DOCUMENTS

| | | | |
|---|---|---|---|
| 2005/0287871 A1* | 12/2005 | Nakayama | G06F 17/5068 439/638 |
| 2010/0002402 A1* | 1/2010 | Rogers et al. | 361/749 |
| 2011/0299713 A1* | 12/2011 | Moller et al. | 381/328 |
| 2015/0237711 A1* | 8/2015 | Rogers et al. | 439/749 |

* cited by examiner

*Primary Examiner* — Suchin Parihar
(74) *Attorney, Agent, or Firm* — Mentor Graphics Corporation

(57) ABSTRACT

This application discloses a computing system implementing tools and mechanisms to import a three-dimensional mechanical model from a mechanical design system. The three-dimensional mechanical model includes a folded representation of a substrate having a surface for placement of electronic components and electrical connections. The tools and mechanisms can identify one or more bends in the surface of the folded representation of the substrate, and generate a two-dimensional layout representation of the substrate for an electronic design system based, at least in part, on the one or more bends in the surface of the folded representation of the substrate.

20 Claims, 7 Drawing Sheets

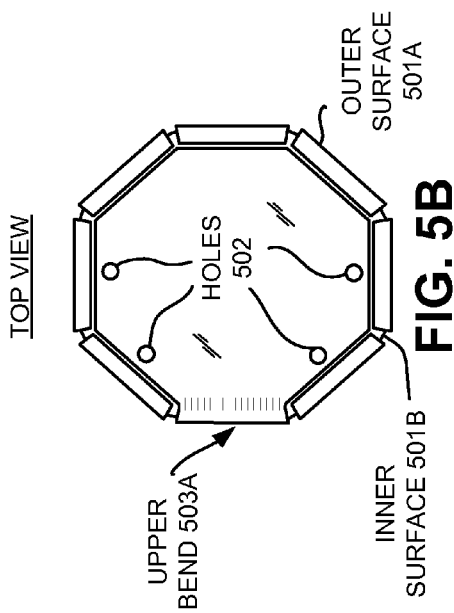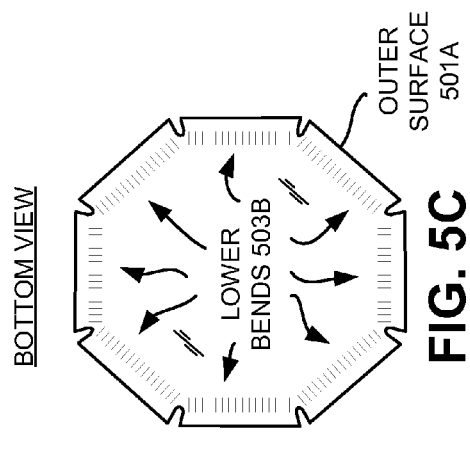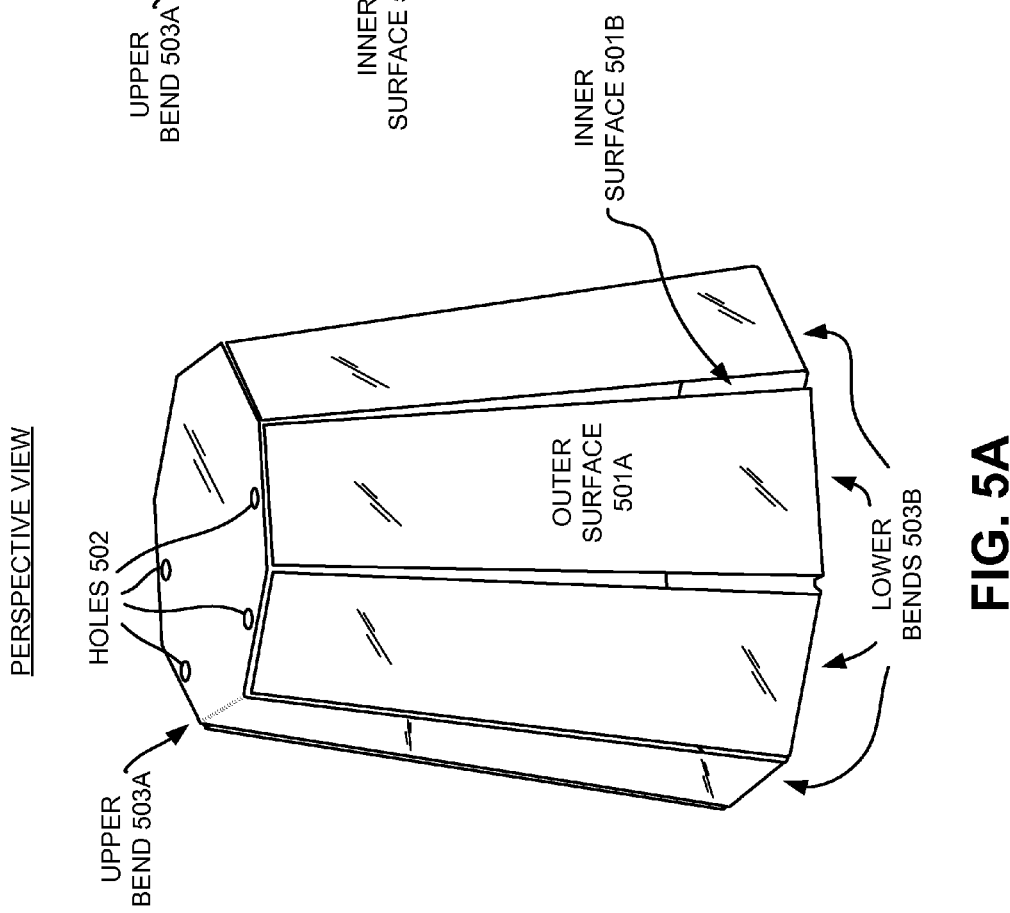

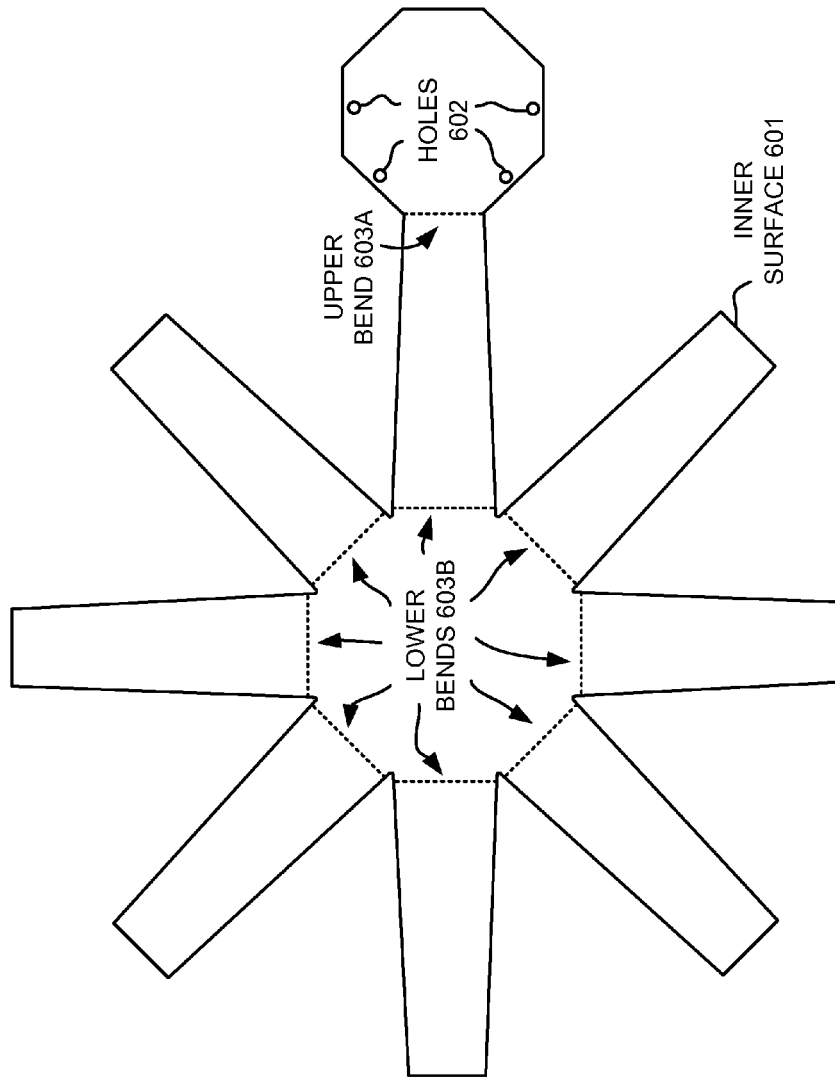

LAYOUT SYNTHESIS OF A THREE-DIMENSIONAL MECHANICAL SYSTEM DESIGN

TECHNICAL FIELD

This application is generally related to electronic design automation and, more specifically, to layout synthesis of a three-dimensional mechanical system design.

BACKGROUND

The development of electronic devices with printed circuit boards typically involves many steps, known as a design flow. This design flow typically starts with a specification for a new circuit to be implemented with a printed circuit board. The specification of the new circuit can be transformed into a circuit design, such as a netlist, for example, by a schematic capture tool or by synthesizing a logical circuit design, sometimes referred to as a register transfer level (RTL) description of the circuit. The netlist, commonly specified in an Electronic Digital Exchange Format (EDIF), can describe nets or connectivity between various devices or instances in the circuit design.

The design flow continues by verifying functionality of the circuit design, for example, by simulating or emulating the circuit design and verifying that the results of the simulation or emulation correspond with an expected output from the circuit design. The functionality also can be verified by statically checking the circuit design for various attributes that may be problematic during operation of an electronic device built utilizing the circuit design.

Once the circuit design has been functionally verified, the design flow continues to design layout and routing, which includes placing and interconnecting various components or parts into a layout representation of a printed circuit board. This procedure can be implemented in many different ways, but typically, through the use of a layout tool, which can present a graphical view of the printed circuit board and allow a designer to drag or place parts from a library onto the layout representation of the printed circuit board. The layout tool can validate the electronic device and perform various design rule checks on placed parts to ensure that the electronic device can be effectively built.

Since many electronic devices made on printed circuit boards will be included within a product, the layout of the printed circuit board may be constrained to ensure the product can be effectively manufactured. For example, the industrial or mechanical design of the product can define the structure of the printed circuit board, without components or parts, to be housed in the product. Since layout tools conventionally utilize planar layout representations of printed circuit boards in order to perform their placing and interconnecting various components or parts, when a configuration of a printed circuit board defined by the industrial or mechanical design is planar, many of these layout tools can convert the defined configuration of the printed circuit board into the planar layout representation.

As products get smaller, however, many industrial or mechanical designs implement non-planar printed circuit board configurations, such as a folded printed circuit board having flexible areas that allow the printed circuit board to be folded into a three-dimensional structure. In these situations, the industrial or mechanical designs can include a three-dimensional mechanical model of the folded printed circuit board to be housed in the product. Conventional layout tools, however, cannot interpret these three-dimensional mechanical models, leaving design teams the onerous task of having to manually build a layout representation of the three-dimensional mechanical model that can be utilized by the layout tools.

SUMMARY

This application discloses a computing system implementing tools and mechanisms to import a three-dimensional mechanical model from a mechanical design system. The three-dimensional mechanical model can include a folded mechanical representation of a substrate, such as a printed circuit board, a flexible substrate, an integrated circuit package, or the any other structure having a surface for placement of electronic components and electrical connections. The tools and mechanisms can identify one or more bends in the surface of the folded representation of the substrate, and generate a two-dimensional layout representation of the substrate for an electronic design system based, at least in part, on the one or more bends in the surface of the folded representation of the substrate. Embodiments of layout synthesis of a three-dimensional mechanical model imported from a mechanical design system are described in greater detail below.

DESCRIPTION OF THE DRAWINGS

FIGS. 5A-5C illustrate an example implementation of a three-dimensional mechanical model for a folded representation of a substrate according to various embodiments of the invention.

FIG. 6 illustrates an example two-dimensional representation of a substrate synthesized from a three-dimensional mechanical model of the substrate according to various embodiments of the invention.

DETAILED DESCRIPTION

Illustrative Operating Environment

The execution of various applications may be implemented using computer-executable software instructions executed by one or more programmable computing devices. Because these embodiments of the invention may be implemented using software instructions, the components and operation of a generic programmable computer system on which various embodiments of the invention may be employed will first be described.

Figure 1:
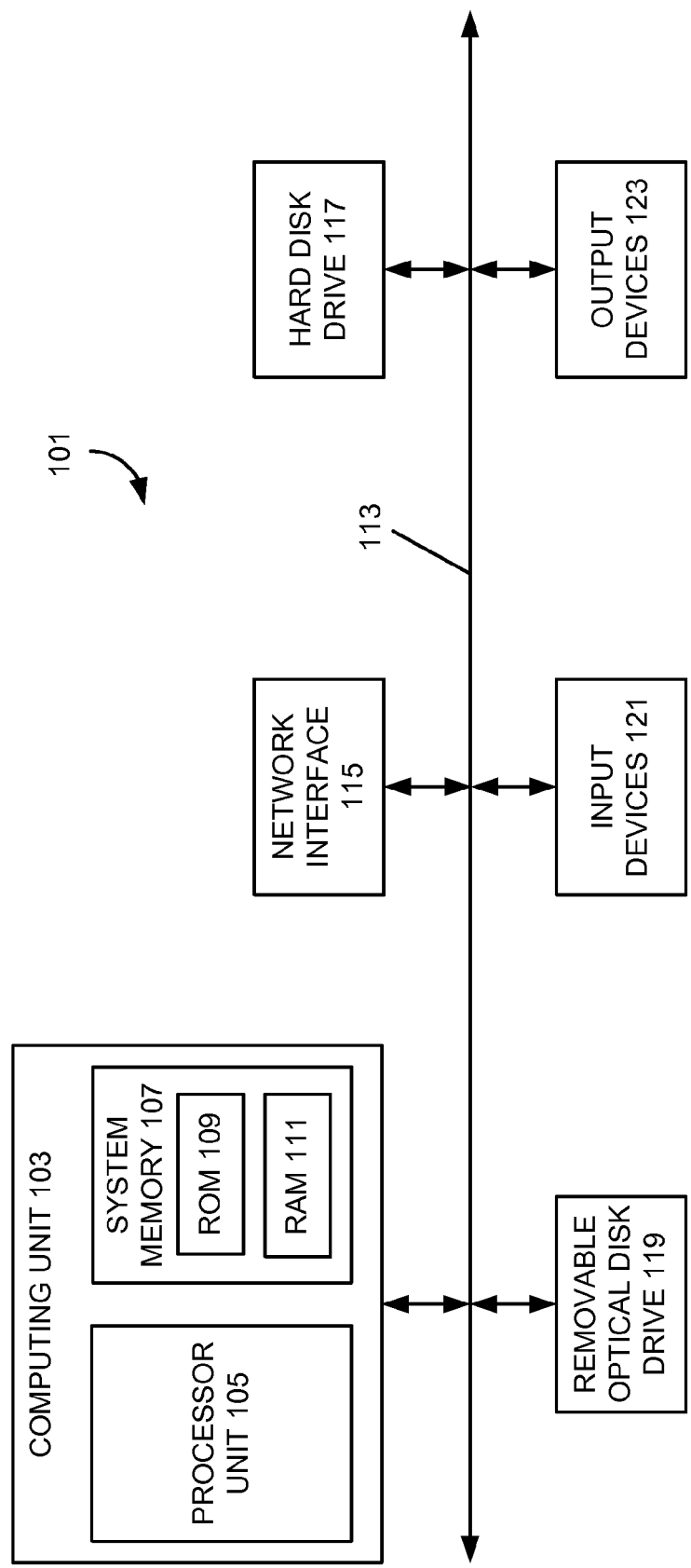
FIGS. 1 and 2 illustrate an example of a computer system of the type that may be used to implement various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computer 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to one or more network interfaces for communicating with other devices making up a network. The network interface translates data and control signals from the computing unit 103 into network messages according to one or more communication protocols, such as the transmission control protocol (TCP) and the Internet protocol (IP). Also, the interface may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
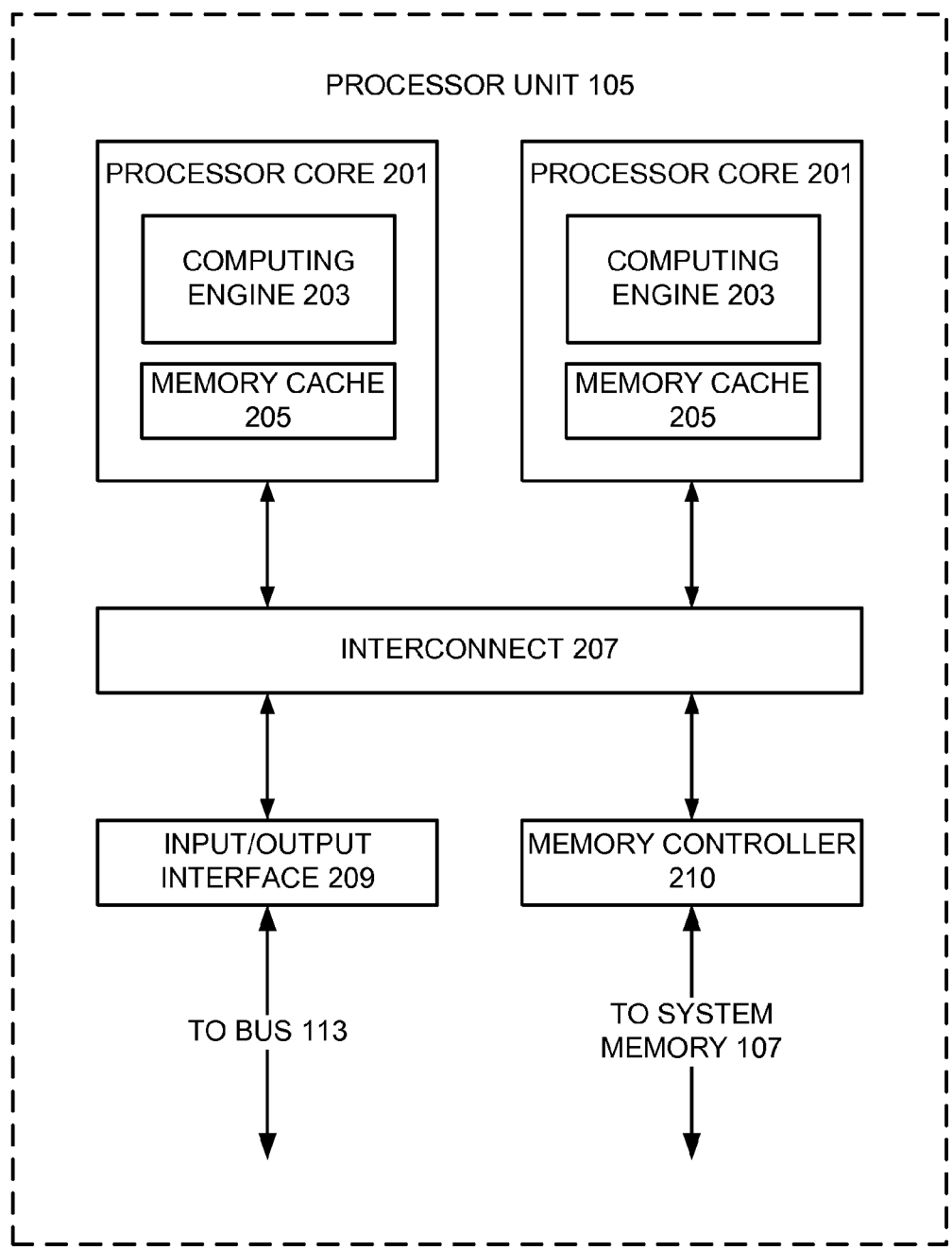

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210 The input/output interface 209 provides a communication interface between the processor unit 201 and the bus 113. Similarly, the memory controller 210 controls the exchange of information between the processor unit 201 and the system memory 107. With some implementations of the invention, the processor units 201 may include additional components, such as a high-level cache memory accessible shared by the processor cores 201.

It also should be appreciated that the description of the computer network illustrated in FIG. 1 and FIG. 2 is provided as an example only, and it not intended to suggest any limitation as to the scope of use or functionality of alternate embodiments of the invention.

Distributed Design System

Figure 3:
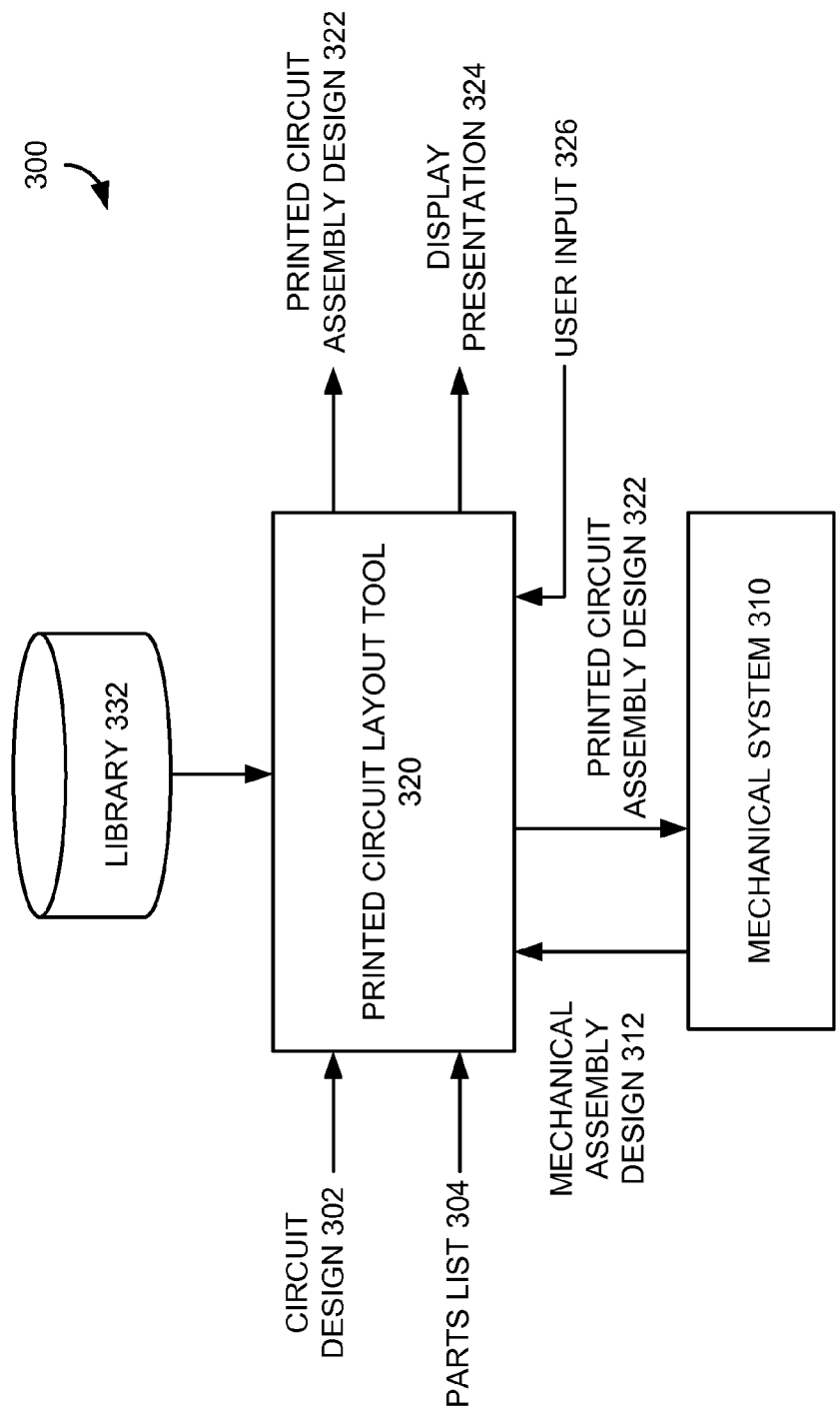
FIG. 3 illustrates an example of a design system according to various embodiments of the invention.

FIG. 3 illustrates an example of a design system 300 according to various embodiments of the invention. Referring to FIG. 3, the design system 300 can be a distributed design environment, which allows different aspects of product design to be performed by different communicating tools or systems. For example, the design system 300 can include a mechanical system 310 to develop a mechanical assembly design 312 for a product, and a printed circuit layout tool 320 to develop a printed circuit assembly design 322 for an electronic device, which can be included in the product.

The mechanical assembly design 312 can describe various physical design elements associated with the product, such as a design for a housing of the product, a mechanical or physical configuration of the printed circuit substrate in the housing, or the like. In some examples, the design for the housing can include locations and dimensions of electronic system(s) and physical interfaces, such as a display device, a touchscreen, an image capture device, input/output devices, electrical ports, audio devices, or the like. The mechanical or physical configuration of the printed circuit substrate in the housing can include a three-dimensional mechanical model that described locations and physical configuration of the surfaces of the printed circuit substrate. The mechanical assembly design 312 also can describe physical mounting information for the physical interfaces and electronic system(s), describe physical connectivity of the physical interfaces and electronic system(s) to each other and to the housing of the product, describe a presence of mechanical heat dissipation devices in the product, or the like.

The printed circuit assembly design 322 can describe the electronic device for the product in terms of various components placed and interconnected on a representation of at least one substrate, such as a printed circuit board, a flexible substrate, an integrated circuit package, or the any other structure having a surface for placement of electronic components and electrical connections. The printed circuit layout tool 320 can provide a design environment to layout a circuit design 302, which can describe the electronic device as sets of interconnected components, into the printed circuit assembly design 322 by placing parts or components from a parts list 304 onto the representation of substrate.

The mechanical system 310 and the printed circuit layout tool 320 can exchange design information with each other. For example, the printed circuit layout tool 320 can output the printed circuit assembly design 322 to the mechanical system 310 or a memory system (not shown) directly or indirectly accessible by the mechanical system 310. Likewise, the mechanical system 310 can output the mechanical assembly design 312 to the printed circuit layout tool 320 or a memory system (not shown) directly or indirectly accessible by the printed circuit layout tool 320. The mechanical system 310 and the printed circuit layout tool 320 can share their respective designs with each other at any point during the design process, for example, through an exchange of design files in the form of STEP (Standard for the Exchange of Product model data) and/or SAT (Standard ACIS Text) files. The format of a STEP file, in some embodiments, can be defined in (International Organization for Standardization) ISO 10303-21, entitled "Industrial automation systems and integration—Product data representation and exchange—Part 21: Implementation methods: Clear text encoding of the exchange structure."

The printed circuit layout tool 320 can analyze the mechanical assembly design 312 to identify the three-dimensional mechanical model that described locations and physical configuration of the surfaces of the substrates. As will be described below in greater detail, the printed circuit layout tool 320 can convert the three-dimensional mechanical model into a two-dimensional representation of one or more substrates. The printed circuit layout tool 320 also can analyze the mechanical assembly design 312 to identify mechanical constraints that can limit or constrain the printed circuit assembly design 322. As discussed above, the mechanical constraints can include a description of an enclosure in which the printed circuit assembly design 322 is to fit in the mechanical assembly design 312, locations and description of fasteners utilized to adhere a substrate manufactured according to the printed circuit assembly design 322 to a housing described in the mechanical assembly design 312, presence and location of other mechanical devices, such as heat dissipation devices or physical interfaces in the mechanical assembly 312, or the like.

The mechanical system 310 can analyze the printed circuit assembly design 322 to determine whether the layout of the electronic device described in the printed circuit assembly design 322 remains congruent with the mechanical assembly design 312. This exchange of design files between the mechanical system 310 and the printed circuit layout tool 320 can allow for a dynamic understanding of how alterations or additions to the mechanical assembly 312 and the printed circuit assembly design 322 can affect design efforts by other groups developing different portions of the product.

The printed circuit layout tool 320 can receive the circuit design 302, such as a netlist, which can describe components in an electronic device and the connectivity of those components to each other. In some embodiments, the netlist can be generated by a schematic capture tool or by synthesizing a logical circuit design, sometimes referred to as a register transfer level (RTL) description of the circuit. The netlist can be specified in an Electronic Digital Exchange Format (EDIF), which can describe nets or connectivity between various components or instances in the circuit design 302. The printed circuit layout tool 320 also can receive the parts list 304 including multiple parts that can correspond to the components described in the circuit design 302. Although FIG. 3 shows the printed circuit layout tool 320 receiving the circuit design 302 and the parts list 304, in some embodiments, the printed circuit layout tool 320 can generate the circuit design 302 and/or parts list 304 internally.

The printed circuit layout tool 320 can output a display presentation 324 that, when displayed by a display device, can provide an user interface to the design environment, allowing the printed circuit layout tool 320 to generate the printed circuit assembly design 322 in response to user input 326. The display presentation 324 can include a graphical display window including at least one representation of the printed circuit assembly design 322 and include various tools or embedded functionality that can allow placement of parts or components from the parts list 304 into the printed circuit assembly design 322.

The printed circuit assembly design 322 initially can represent a blank substrate, for example, a two-dimensional representation of the substrate described in the three-dimensional mechanical model from the mechanical assembly design 312. The printed circuit layout tool 320 can receive user input 326, for example, based on the display presentation 324, which can prompt the printed circuit layout tool 320 to perform various updates to the printed circuit assembly design 322 based on the circuit design 302, such as place parts selected or composited from the parts list 304 in the printed circuit assembly design 322, route traces between the placed parts or composite parts, or the like. In some embodiments, the printed circuit layout tool 320, in response to a user selection of a part from the parts list 304, can access a library 332 to identify a component model corresponding to the selected part capable of being placed in the representation of the printed circuit assembly design 322.

The printed circuit layout tool 320 can perform various design rule checks on the printed circuit assembly design 322 to determine whether the updates in the printed circuit assembly design 322 violate any design rules. For example, the printed circuit layout tool 320 can review locations and characteristics of component models or composite solid models placed in the representation of the substrate to determine whether the component models or composite solid models, as placed, conform to the design rules. The printed circuit layout tool 320 can update the display presentation 324 based on the user input 326, for example, to illustrate the placement of a selected part or route of a trace line and highlight conformance or lack thereof with at least one of the design rules, which can be displayed or presented by the display device. This interactive design process can continue until layout of the circuit design 302 has been completed and thus the printed circuit layout tool 320 has generated the printed circuit assembly design 322 congruent with the mechanical assembly design 312. Since the mechanical system 310 and the printed circuit layout tool 320 can exchange their respective designs with each other at any time during the design process, any changes in one design that conflict with another design can be caught and rectified earlier in the process.

Printed Circuit Board Layout Tool with Layout Synthesis

Figure 4:
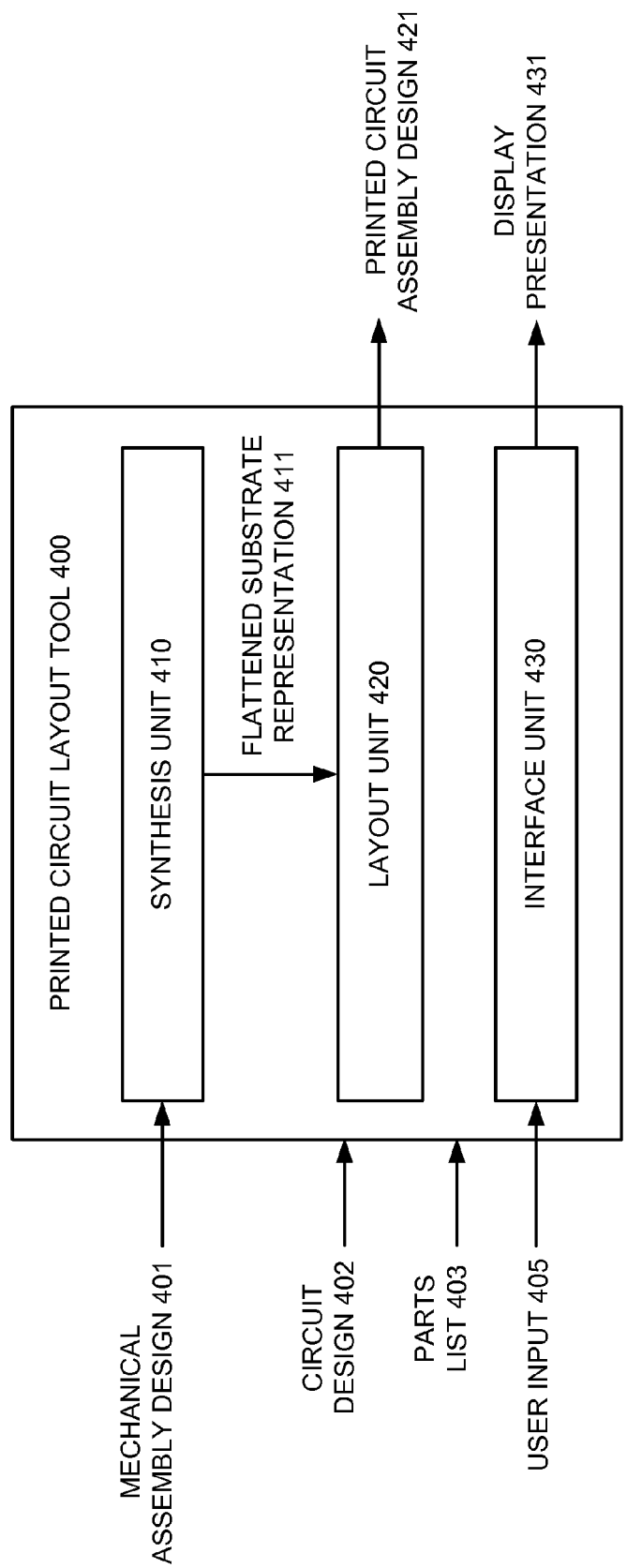
FIG. 4 illustrates an example of a printed circuit layout tool according to various embodiments of the invention.

FIG. 4 illustrates an example of a printed circuit layout tool 400 according to various embodiments of the invention. Referring to FIG. 4, the printed circuit layout tool 400 can include a synthesis unit 410 to receive a mechanical assembly design 401, for example, directly from a mechanical design system or indirectly via an interface or memory system. In some embodiments, the mechanical assembly design 401 can be a mechanical design file in the form of a STEP file, a SAT file, or other file format.

The synthesis unit 410 can identify a three-dimensional model for at least one substrate in the mechanical assembly design 401. The three-dimensional model for the substrate can define one or more surfaces corresponding to the substrate, mechanical features in the substrate, such as holes, or the like, locations where the one or more surfaces of the substrate bend or fold, and/or specific information related to the bends or folds, such as a bend radius, a bend angle, or the like.

FIGS. 5A-5C illustrate an example implementation of a three-dimensional mechanical model for a folded representation of a substrate according to various embodiments of the invention. Referring to FIGS. 5A-5C, the three-dimensional mechanical model can include a substrate folded or bent to form a three-dimensional structure or folded representation of the substrate. Although FIGS. 5A-5C show a single substrate folded into a three-dimensional structure, in some embodiments, the three-dimensional mechanical model can include multiple substrates that form one or more three-dimensional structures.

The substrate can have an outer surface 501A and an inner surface 501B, which can be folded or bent at an upper bend 503A and at lower bends 503B to form the three-dimensional structure or the folded representation of the substrate. The three-dimensional mechanical model can describe different portions or areas of the substrate by their characteristics. For example, certain portions of the substrate can be rigid, while other portions, such as the upper bend 503A and the lower bends 503B, can be flexible. The three-dimensional mechanical model can describe the location of the upper bend 503A and the lower bends 503B, a radius of each bend, an angle of each bend, or the like. The three-dimensional mechanical model also can include mechanical features, such as holes 502, substrate thickness, millings, or the like. For example, the three-dimensional mechanical model can describe the holes 502 by their location on the substrate, their size, or the like.

Referring back to FIG. 4, the synthesis unit 410 can extract the information from the three-dimensional model for the substrate in the mechanical assembly design 401 and generate a two-dimensional or flattened substrate representation 411 of the three-dimensional model for the substrate. The two-dimensional or flattened substrate representation 411 can be a planar representation of the three-dimensional model for the substrate. Embodiments of the generation of the two-dimensional or flattened substrate representation 411 of the three-dimensional model for the substrate will be described below in greater detail.

FIG. 6 illustrates an example two-dimensional representation of a substrate synthesized from a three-dimensional mechanical model of the substrate according to various embodiments of the invention. Referring to FIG. 6, the two-dimensional representation of the substrate can correspond to a flattened or unfolded version of the three-dimensional mechanical model for the substrate shown in FIGS. 5A-5C.

The two-dimensional representation of the substrate can flatten or unfold the three-dimensional mechanical model for the substrate to expose an inner surface 601 of the three-dimensional structure described in in FIGS. 5A-5C. Although FIG. 6 shows the inner surface 601 of the two-dimensional representation of the substrate, in other embodiments, an outer surface of the three-dimensional structure described in in FIGS. 5A-5C may be presented.

The two-dimensional representation of the substrate can include identifiers of an upper bend 603A and lower bends 603B. In some embodiments, an electronic design system model for the two-dimensional representation of the substrate can include additional information for the upper bend 603A and the lower bends 603B, such as a bend radius, a bend angle, a direction of the bend, or the like. The two-dimensional representation of the substrate also can preserve other mechanical features present in the three-dimensional mechanical model, such as the presence and description of holes 602, thicknesses, millings, or the like.

Referring back to FIG. 4, the printed circuit board layout tool 400 can include a layout unit 420 to layout a circuit design 402 on the flattened substrate representation 411 with parts from a parts list 403, which generates a printed circuit assembly design 421. The circuit design 402, such as a netlist, can describe components in an electronic device and the connectivity of those components to each other. In some embodiments, the netlist can be generated by a schematic capture tool or by synthesizing a logical circuit design, sometimes referred to as a register transfer level (RTL) description of the circuit. The netlist can be specified in an Electronic Digital Exchange Format (EDIF), which can describe nets or connectivity between various components or instances in the circuit design 402. The parts list 403 can include multiple parts that can correspond to the components described in the circuit design 402. Although FIG. 4 shows the printed circuit board layout tool 400 receiving the circuit design 402 and the parts list 404, in some embodiments, the printed circuit board layout tool 400 can generate the circuit design 402 and/or parts list 404 internally.

In some embodiments, the layout unit 410 can generate a layout representation of the circuit design 402, which can be a two-dimensional version of the printed circuit assembly design 421. The layout representation of the circuit design 402 can, for example, be embodied in a 2.5-dimensional data model with 2.5-dimensional component models, such as component models 405. The layout representation of the circuit design 402 also can include a two-dimensional graphical presentation, for example, based on the 2.5-dimensional data model. In some embodiments, the layout unit 410 can include a two-dimensional kernel, for example, implemented by a computing system in response to computer-executable instructions, which can generate a 2.5-dimensional data model of the printed circuit assembly design 421.

In some embodiments, the layout unit 410 also can generate a layout representation of the circuit design 402, which can be a three-dimensional version of the printed circuit assembly design 421. The layout representation of the circuit design 402 can, for example, be embodied in a three-dimensional data model. The three-dimensional data model can include three-dimensional characteristics and parameters of the substrate and three-dimensional component solid models, such as component models 405, placed on the substrate. The three-dimensional component solid models can describe a three-dimensional physical structure of each component placed on in the three-dimensional version of the printed circuit assembly design 421, including specific configurations of the connectors. The layout representation of the circuit design 402 also can include a three-dimensional graphical presentation, for example, based on the three-dimensional data model, which, in some embodiments, can provide a photo realistic visualization of the three-dimensional version of the printed circuit assembly design 421. In some embodiments, the layout unit 410 can include a three-dimensional kernel, for example, implemented by a computing system in response to computer-executable instructions, which can generate a three-dimensional data model of the printed circuit assembly design 421.

The printed circuit layout tool 400 can include an interface unit 430 to output a display presentation 431 that, when displayed by a display device, can provide a user interface to the design environment. The display presentation 431 can include a graphical display window including at least one layout representation of the printed circuit assembly design 421 from the layout unit 420 and include various tools or embedded functionality that can allow placement of parts or components from the parts list 403 into the layout representation of the printed circuit assembly design 421. In some embodiments, the interface unit 430 can receive a two-dimensional layout representation and/or a three-dimensional layout representation of the printed circuit assembly design 421 from the layout unit 420 and selectively insert the recited layout representations in the display presentation 431.

Figure 7:
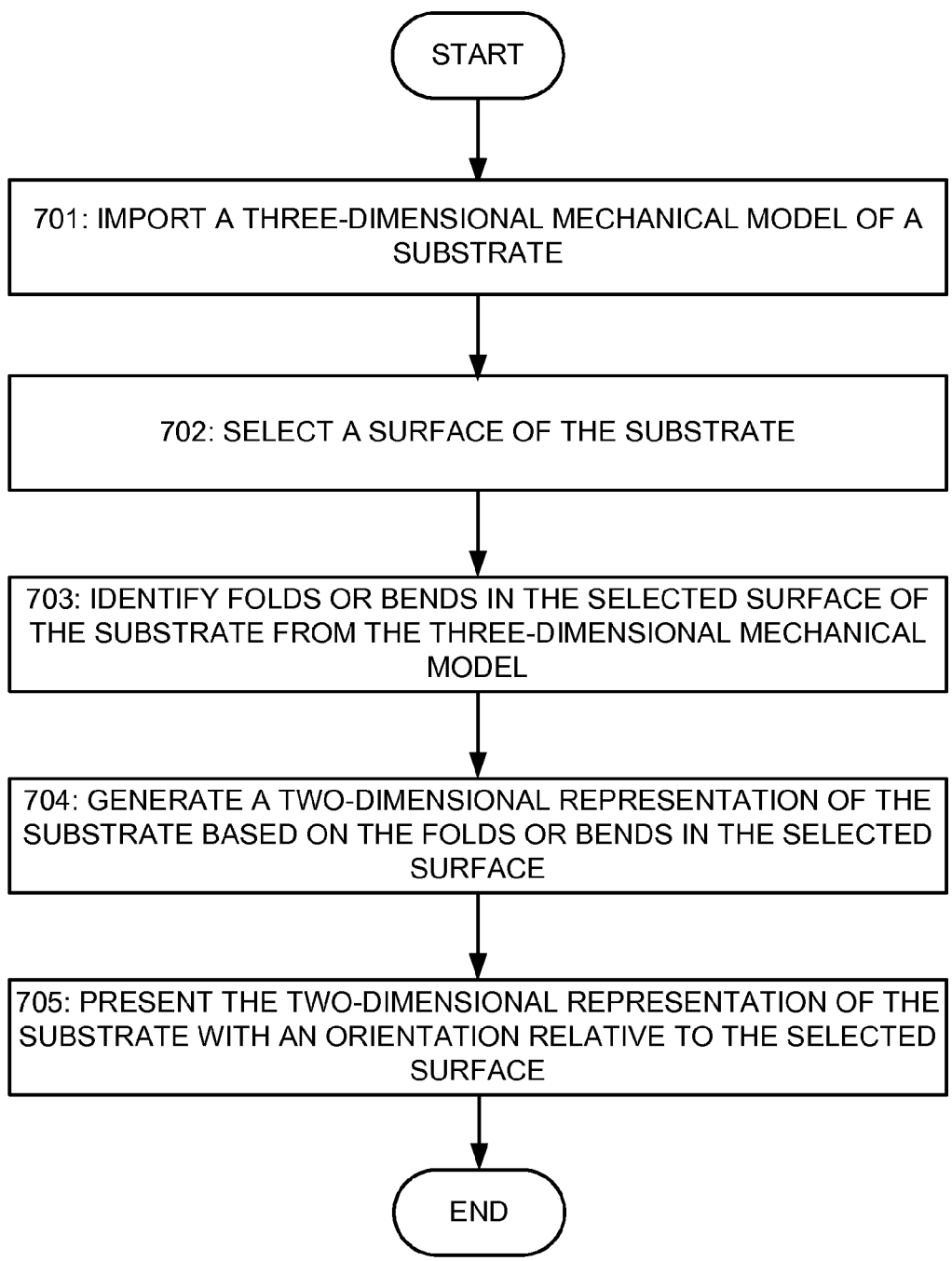
FIG. 7 illustrates an example flowchart for converting a three-dimensional mechanical model for a substrate into a two-dimensional representation of the substrate according to various embodiments of the invention.

FIG. 7 illustrates an example flowchart for converting a three-dimensional mechanical model for a substrate into a two-dimensional representation of the substrate according to various embodiments of the invention. Referring to FIG. 7, in a block 701, a computing system implementing a layout tool can import a three-dimensional mechanical model of the substrate, which can be a printed circuit board, a flexible material, an integrated circuit package, or any other three-dimensional structure having a surface for placement of electronic components and electrical connections. The computing system can receive the three-dimensional mechanical model of the substrate directly from a mechanical system or indirectly via a memory system (not shown) accessible by the computing system. In some embodiments, the three-dimensional mechanical model of the substrate received by the computing system can be design files in the form of STEP (Standard for the Exchange of Product model data), SAT (Standard ACIS Text) files, or other file format.

In a block 702, the computing system implementing the layout tool can select a surface of the substrate in the three-dimensional mechanical model. In some embodiments, the computing system can receive user input indicative of a surface of the printed circuit board, and the computing system can select the surface identified by the user input. In other embodiments, the computing system can automatically select the surface of the substrate in the three-dimensional mechanical model, for example, based on the configuration of the three-dimensional structure, bends or folds in the surface of the substrate in the three-dimensional mechanical model, or the like.

In a block 703, the computing system can identify folds or bends in the selected surface of the substrate described in the three-dimensional mechanical model. The computing system can extract information from the three-dimensional mechanical model and identify different areas or portions of the substrate, such as locations and attributes of the surfaces in the three-dimensional mechanical model, rigid areas, flexible areas in the three-dimensional mechanical model, or the like. In some embodiments, the computing system can identify the flexible areas in extracted portions of the three-dimensional mechanical model based on orientation changes, curvature, bending, or folding, of the surfaces. For example, when the extracted information indicates that a surface changes orientation, the computing system can determine the area corresponding to the change in orientation is associated with a bend or a fold in the selected surface of the substrate.

In a block 704, the computing system can generate a two-dimensional layout representation of the substrate based on the identified folds or bends in the surfaces of the substrate. In some embodiments, the computing system can unfold the bends or folds in the surfaces present in the identified flexible areas, which can render the surface of the substrate planar, rather than folded or bent in the three-dimensional mechanical model. The two-dimensional layout representation can include an identifier of the folds, bends, or flexible areas, which can include bend radius, a bend angle, a direction of the bend, or the like. The computing system can also augment the two-dimensional layout representation of the substrate to include other mechanical features described in the three-dimensional mechanical model, such as a presence of holes, thicknesses, millings, etc. In a block 705, the computing system can present the two-dimensional representation of the substrate with an orientation relative to the selected surface.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   importing, by a computing system implementing an electronic design system, a three-dimensional mechanical model from a mechanical design system, wherein the three-dimensional mechanical model includes a folded representation of a substrate having a curved surface;
   utilizing, by the computing system, the curved surface of the substrate in the three-dimensional mechanical model to identify one or more bends in the folded representation of the substrate included in the three-dimensional mechanical model; and
   generating, by the computing system, a two-dimensional layout representation of the substrate for the electronic design system for placement of electronic components and electrical connections by unfolding the one or more bends in the folded representation of the substrate into the two-dimensional layout representation of the substrate.

2. The method of claim 1, wherein the curved surface was unfolded in the two-dimensional layout representation of the substrate into a planar surface.

3. The method of claim 1, wherein the substrate includes at least one of a printed circuit board, a flexible substrate, or an integrated circuit package.

4. The method of claim 1, further comprising:
   selecting, by the computing system, the curved surface of the substrate; and
   presenting, by the computing system, the two-dimensional layout representation of the substrate with an orientation relative to the selected surface.

5. The method of claim 1, further comprising:
   extracting, by the computing system, portions of the folded representation of the substrate; and
   identifying, by the computing system, the one or more bends in the substrate reside in the extracted portions of the substrate based on orientation changes in the curved surface of the substrate.

6. The method of claim 1, further comprising placing, by the computing system, electronic parts on the two-dimensional layout representation of the substrate to generate a printed circuit assembly design.

7. The method of claim 1, further comprising:
   identifying, by the computing system, mechanical features on the curved surface in the three-dimensional mechanical model; and
   modifying, by the computing system, the two-dimensional layout representation of the substrate to include representations of the identified mechanical features.

8. A system comprising:
   a memory device configured to store machine-readable instructions; and
   a computing system including one or more processing devices, in response to executing the machine-readable instructions, configured to:
   import a three-dimensional mechanical model from a mechanical design system, wherein the three-dimensional mechanical model includes a folded representation of a substrate having a curved surface;
   utilize the curved surface of the substrate in the three-dimensional mechanical model to identify one or more bends in the folded representation of the substrate included in the three-dimensional mechanical model; and
   generate a two-dimensional layout representation of the substrate for the electronic design system for placement of electronic components and electrical connections by unfolding the one or more bends in the folded representation of the substrate into the two-dimensional layout representation of the substrate.

9. The system of claim 8, wherein the curved surface was unfolded in the two-dimensional layout representation of the substrate into a planar surface.

10. The system of claim 8, wherein the substrate includes at least one of a printed circuit board, a flexible substrate, or an integrated circuit package.

11. The system of claim 8, wherein the one or more processing devices, in response to executing the machine-readable instructions, are configured to:
   select the curved surface of the substrate; and
   present the two-dimensional layout representation of the substrate with an orientation relative to the selected surface.

12. The system of claim 8, wherein the one or more processing devices, in response to executing the machine-readable instructions, are configured to:

extract portions of the folded representation of the substrate; and identify the one or more bends in the substrate reside in the extracted portions of the substrate based on orientation changes in the curved surface of the substrate.

13. The system of claim 8, wherein the one or more processing devices, in response to executing the machine-readable instructions, are configured to place electronic parts on the two-dimensional layout representation of the substrate to generate a printed circuit assembly design.

14. An apparatus comprising at least one computer-readable memory device storing instructions configured to cause one or more processing devices to perform operations comprising:

importing a three-dimensional mechanical model from a mechanical design system, wherein the three-dimensional mechanical model includes a folded representation of a substrate having a curved surface;

utilizing the curved surface of the substrate in the three-dimensional mechanical model to identify one or more bends in the folded representation of the substrate included in the three-dimensional mechanical model; and generating a two-dimensional layout representation of the substrate for the electronic design system for placement of electronic components and electrical connections by unfolding the one or more bends in the folded representation of the substrate into the two-dimensional layout representation of the substrate.

15. The apparatus of claim 14, wherein the curved surface was unfolded in the two-dimensional layout representation of the substrate into a planar surface.

16. The apparatus of claim 14, wherein the substrate includes at least one of a printed circuit board, a flexible substrate, or an integrated circuit package.

17. The apparatus of claim 14, wherein the instructions configured to cause the one or more processing devices to perform operations further comprising:

selecting the curved surface of the substrate; and presenting the two-dimensional layout representation of the substrate with an orientation relative to the selected surface.

18. The apparatus of claim 14, wherein the instructions configured to cause the one or more processing devices to perform operations further comprising:

extracting portions of the folded representation of the substrate; and identifying the one or more bends in the substrate reside in the extracted portions of the substrate based on orientation changes in the curved surface of the substrate.

19. The apparatus of claim 14, wherein the instructions configured to cause the one or more processing devices to perform operations further comprising placing electronic parts on the two-dimensional layout representation of the substrate to generate a printed circuit assembly design.

20. The apparatus of claim 14, wherein the instructions configured to cause the one or more processing devices to perform operations further comprising:

identifying mechanical features on the curved surface in the three-dimensional mechanical model; and modifying the two-dimensional layout representation of the substrate to include representations of the identified mechanical features.

* * * * *